United States Patent [19]

Smith

[11] Patent Number: 5,726,844
[45] Date of Patent: Mar. 10, 1998

[54] PROTECTION CIRCUIT AND A CIRCUIT FOR A SEMICONDUCTOR-ON-INSULATOR DEVICE

[75] Inventor: Jeremy C. Smith, Austin, Tex.

[73] Assignee: Motorola, Inc., Schaumburg, Ill.

[21] Appl. No.: 625,858

[22] Filed: Apr. 1, 1996

[51] Int. Cl.$^6$ ........................................ H02H 9/00
[52] U.S. Cl. ................................ 361/56; 361/111
[58] Field of Search ........................... 361/18, 56, 58, 361/91, 110, 111, 118, 119, 126, 127; 257/355–366

[56] References Cited

U.S. PATENT DOCUMENTS

| | | | |
|---|---|---|---|
| 4,063,274 | 12/1977 | Dingwall | 357/53 |
| 4,173,022 | 10/1979 | Dingwall | 357/23 |
| 4,272,881 | 6/1981 | Angle | 29/571 |
| 4,274,193 | 6/1981 | Angle | 29/571 |
| 4,423,431 | 12/1983 | Sasaki | 357/41 |
| 4,989,057 | 1/1991 | Lu | 357/23.7 |
| 5,144,519 | 9/1992 | Chang | 361/58 |
| 5,399,507 | 3/1995 | Sun | 437/24 |
| 5,477,414 | 12/1995 | Li et al. | 361/56 |

OTHER PUBLICATIONS

Colinge; Silicon–on–Insulator Technology: Materials to VLSI; Kluwer Academic Publishers; pp. 102–106 (1991).
Wolf; Silicon Processing For The VLSI ERA vol. 2: Process Integrations; Lattice Press; pp. 72–75 (1990).
Palumbo, et al.; "Design and Characterization Of Input Protection Networks For CMOS/SOS Applications;" EOS/ESD Symposium Proceedings; pp. 182–187 (Sep. 1986).
Sun; 08/368,673; Jan. 3, 1995 United States of America.

*Primary Examiner*—Ronald W. Leja
*Attorney, Agent, or Firm*—George R. Meyer

[57] ABSTRACT

A protection circuit (10) for a semiconductor-on-insulator device (20) allows an electrostatic event to occur at an input/output pad (12) without adversely affecting sensitive circuits, such as MOSFETs used in digital circuits. The protection circuit (10) allows the input/output pad (12) to be biased positively and negatively with respect to two different supply potentials and to other input/output pads on the chip. A body-tied MOSFET (14) is used in the protection circuit (10) where its drain regions (38) lie outside MOSFET's closed loop gate electrode (34).

29 Claims, 5 Drawing Sheets

PROTECTION CIRCUIT AND A CIRCUIT FOR A SEMICONDUCTOR-ON-INSULATOR DEVICE

RELATED APPLICATION

This is related to U.S. patent application Ser. No. 08/625, 861, entitled 'Semiconductor-On-Insulator Device And A Process For Forming the Device' by Jeremy Smith et al., filed of even date, assigned to the current assignee hereof.

FIELD OF THE INVENTION

The present invention relates to protection circuits, and in particular, to semiconductor-on-insulator (SOI) devices having protection circuits and processes for forming the devices.

BACKGROUND OF THE INVENTION

Input protection circuits are typically used in integrated circuits to protect sensitive internal circuits within the device from electrostatic discharge (ESD). The three common types of components used for ESD protection in conventional semiconductor devices (within a bulk semiconductor material) include pn junctions, metal-oxide-semiconductor field-effect transistors (MOSFETs), and thick field oxide (TFO) punch-through devices. In each of these three types of components, the breakdown voltage of the component is typically determined by the breakdown voltage of a pn junction within the component. The area of the pn junction is usually adequate because the bottom and side edges of the diffused region that is part of the pn junction are typically adjacent to the substrate itself. Therefore, excess charge during the electrostatic discharge dissipates over a relatively large area.

The components used for ESD protection circuits for bulk semiconductor materials cannot readily be used by themselves in SOI devices. Much of the area of the pn junction is lost because the bottom edges of diffused regions touch a buried oxide layer (an insulator) and are bounded on the sides by field oxide. Thus, the buried oxide layer prevents a pn junction from being formed under a p-type or n-type region. Therefore, a much smaller area has to dissipate the excess charge. An electrostatic discharge in a SOI MOSFET increases the heating of the MOSFET because the energy does not dissipate as effectively as the buried oxide layer is a poor thermal conductor. The increased heating lowers the current threshold at which device damage can occur. The point at which this current threshold occurs is called the second-breakdown current value ($I_{t2}$) of the transistor. Once $I_{t2}$ is exceeded, the device is permanently damaged because silicon within the transistor channel melts and forms a low resistance filament after cooling. Thick field oxide devices cannot be used over a buried oxide region since the field oxide typically touches buried oxide in SOI. The result is that there is no punch-through path in which the discharge current can flow.

A need exists for forming a protection circuit for an SOI device that will allow the circuit to be adequately protected from ESD potentials that may reach an input/output pad of an integrated circuit.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

A protection circuit for a semiconductor-on-insulator device allows an electrostatic event to occur at an input/output pad without adversely affecting sensitive circuit components, such as MOSFETs used in digital circuits. The protection circuit allows the input/output pad to be biased positively and negatively with respect to the supply rails and all other pads on the chip.

Figure 1:
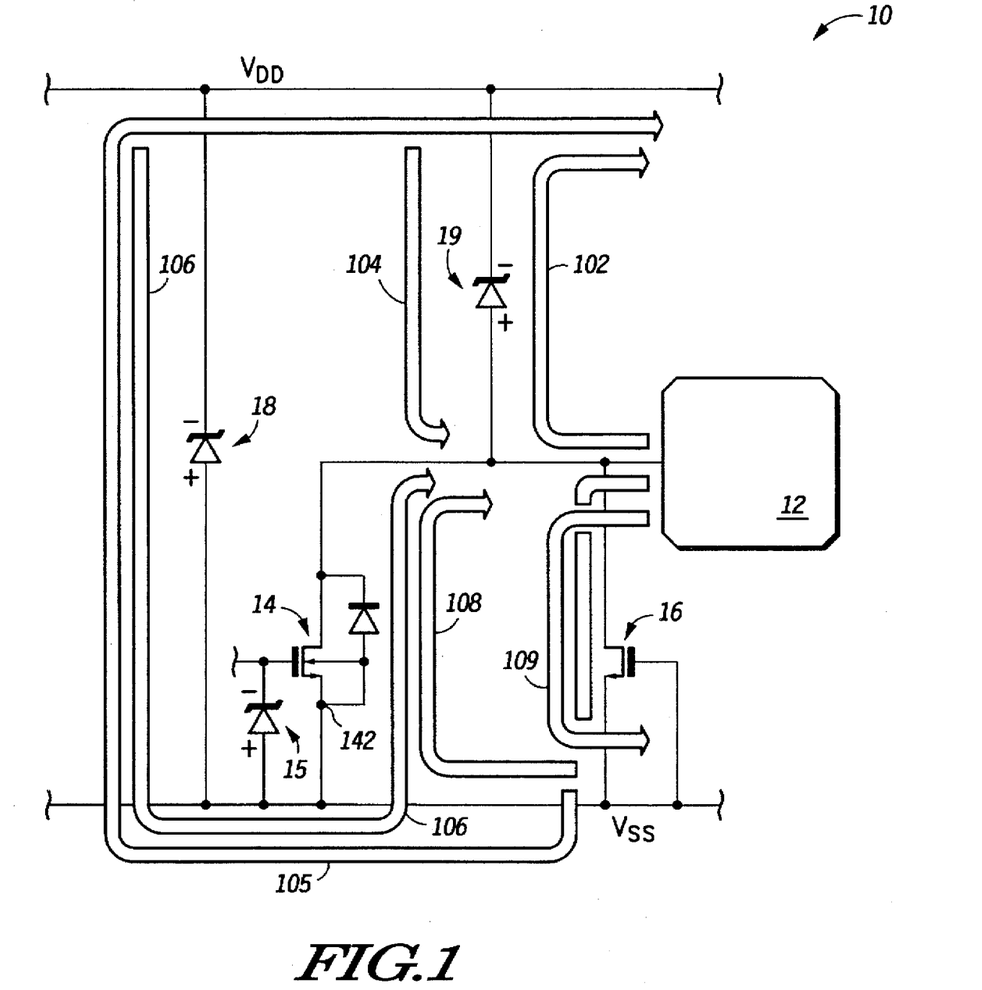
FIG. 1 includes a circuit diagram of a portion of an input protection circuit for an SOI device in accordance with an embodiment of the present invention.

FIG. 1 is a circuit diagram of a portion of a protection circuit 10 for an input/output (I/O) pad 12 that is electrically connected to an I/O node. Within this specification, the current electrodes of MOSFETs electrically connected to a supply node ($V_{DD}$ or $V_{SS}$) are the sources, and the other current electrodes for those same MOSFETs are the drains. The circuit 10 further includes a body-tied MOSFET 14 and an n-channel MOSFET 16. The drains of the MOSFETs 14 and 16 are electrically connected to the I/O node and the sources are electrically connected to a $V_{SS}$ node that is coupled to receive a $V_{SS}$ potential from a $V_{SS}$ electrode (not shown). In MOSFET 14, a body-tie is used to electrically connect the channel region to the source region of the transistor as illustrated near node 142. The junction between the channel region and the drain region forms a pn diode as illustrated in FIG. 1. The gate of MOSFET 16 is electrically connected to the $V_{SS}$ node. Those skilled in the art appreciate that MOSFET 16 is a "grounded-gate" MOSFET that relies on parasitic bipolar action between the source and drain of the MOSFET for ESD protection. The potential difference (between the source and drain of a MOSFET) at which the parasitic bipolar action starts is referred to in the industry as BVDSS.

The circuit 10 further includes zener diodes 15, 18, and 19 that each has a positive terminal and a negative terminal. The positive terminal of zener diode 15 is electrically connected to the $V_{SS}$ node and the negative terminal is electrically connected to the gate of MOSFET 14. The positive terminal of zener diode 18 is electrically connected to the $V_{SS}$ node and the negative terminal is electrically connected to a $V_{DD}$ node that is coupled to receive a $V_{DD}$ potential from a $V_{DD}$ electrode (not shown). For zener diode 19, the positive terminal is electrically connected to the I/O node and the negative terminal is electrically connected to the $V_{DD}$ node.

Zener diode 18 is a specific type of rail clamp. The function of the rail clamp is to provide an ESD discharge path between the supply rails. A MOSFET, bipolar transistor, TFO device, or capacitor can also be used as a rail clamp in place of zener diode 18. Any combination of these five types of components can also be used as a rail clamp.

In one embodiment, the $V_{DD}$ potential is approximately 2.0 volts, and the $V_{SS}$ potential is approximately 0.0 volts. Each of the MOSFETs 14 and 16 has a threshold voltage of approximately 0.5 volts. MOSFET 14 has a breakdown voltage of approximately 7.0 volts, and MOSFET 16 has a breakdown voltage of approximately 3.5 volts. The specific numbers are meant to illustrate and not limit the invention.

The protection circuit 10 is used to protect digital circuits under a variety of unbiased or biased ESD scenarios. The primary discharge paths are indicated by paths 102, 104, 106, 108, and 109. Current flows as illustrated by path 102 when the potential of the I/O pad 12 is higher than that of the VDD node. Diode 19 has a forward cut-in potential of approximately 0.7 volts. Therefore, when the potential of the I/O pad 12 is more than 0.7 volts higher than the potential of the $V_{DD}$ node, current flows as shown by path 102. If the $V_{DD}$ node is at approximately 2.0 volts, current flows as shown by path 102 when the I/O pad 12 is at approximately 2.7 volts or higher.

Paths 104 and 106 illustrate current flow when the potential of the I/O pad 12 is significantly less that the $V_{DD}$ node. Current flows as shown by 104 when the potential of the $V_{DD}$ node is at least 5 volts higher than the potential of the I/O pad 12. If the $V_{DD}$ node is at approximately 2.0 volts, current will flow as shown by path 104 when the I/O pad 12 is approximately −3.0 volts. Current flows as shown by path 106 when the potential difference between the $V_{DD}$ node and the I/O pad 12 exceeds the sum of the reverse breakdown voltage of diode 18 (VRBD18) and the forward cut-in potential of the drain diode of MOSFET 14. Using numbers, this potential difference is approximately 5.7 volts. If the $V_{DD}$ node is at approximately 2.0 volts, current will flow as shown by path 106 when the I/O pad is approximately −3.7 volts.

Zener diode 18 is referred to as a "bus zener" because it is electrically connected between the $V_{SS}$ and $V_{DD}$ nodes. A semiconductor-on-insulator device will have other I/O pads 12 and zener diodes 18 similar to the ones shown. Although current flows as shown by path 106 through the "local" diode 18, other diodes 18 at other pads can carry a portion of the current. The discharge path indicated by path 106 forms an auxiliary (secondary) path for pad-to-VDD negative stress conditions. Note that path 106 could be a primary path if the sum of VRBD18 and the forward cut-in potential of the drain diode of MOSFET 14 is less than VRBD19. Thus diode 19 could be replaced by a standard pn diode (not a zener diode) as determined by impurity atom concentration, without loss of generality. A standard pn diode is typically not used to allow significant current flow during typical reverse biasing conditions. A zener diode is typically used when significant current is to flow when the reverse bias potential difference across the zener diode is no more than 10 volts. in this embodiment, the zener diodes allow significant current to flow when the reverse bias potential difference is about 5.0 volts. The different zener diodes could be tailored to have different reverse bias breakdown voltages.

In protection circuit 10, paths 108 and 109 illustrate current flow when the I/O pad 12 is at a potential higher and lower than the potential of the $V_{SS}$ node. The drain diode of MOSFET 14 has a forward cut-in potential of approximately 0.7 volts. Current flows as illustrated by path 108 when the potential of the $V_{SS}$ node is more than 0.7 volts higher than the potential of the I/O pad 12. If the $V_{SS}$ node is at approximately 0 volts, current flows as shown by path 108 when the I/O pad 12 is approximately −0.7 volts or lower. Current flows as illustrated by path 109 when the potential difference of the I/O pad 12 minus the $V_{SS}$ node exceeds BVDSS for MOSFET 16, which is approximately 3.5 volts. If the $V_{SS}$ node is at approximately 0 volts, current flows as shown by path 109 when the I/O pad 12 is approximately 3.5 volts or higher.

Figure 5:
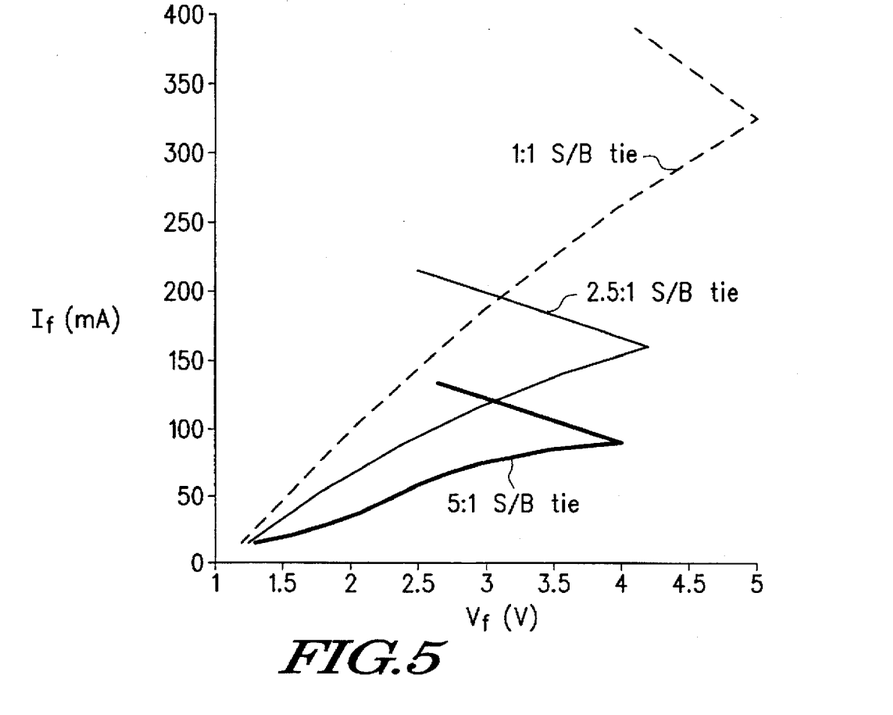
FIG. 5 includes a plot of forward bias voltage versus current of a transistor drain diode as the tie-frequency of a body-tied MOSFET is varied.

Because MOSFET 14 is a body-tied transistor, paths 106 and 108 would not exist at the potentials specified above. If MOSFET 14 would not have any body ties, the channel region of MOSFET 14 would electrically float, in which case path 108 would not exist. The body tie of MOSFET 14 provides further benefit by increasing the BVDSS of MOSFET 14 compared to the same transistor without the body tie. This helps make path 109 a primary path through MOSFET 16 rather than parallel paths through MOSFETs 14 and 16 or a primary path from the I/O pad 12 to the $V_{SS}$ node through MOSFET 14. MOSFET 16 is specifically optimized to pass the high currents associated with ESD events. The optimizations needed for MOSFET 16 are, in general, contrary to those needed for good electrical performance of MOSFET 14. It is advantageous to ensure that BVDSS will occur initially in MOSFET 16 and that MOSFET 14 will not breakdown within the operating range of MOSFET 16. The effect on BVDSS of body-tie frequency is shown in FIG. 5 that will be described in more detail later in this specification. The higher the body tie frequency in MOSFET 14 the higher the increase in its BVDSS.

In an alternate embodiment, zener diode 19 can be omitted. In this embodiment, when the I/O pad 12 is at a potential significantly lower than the $V_{DD}$ node, current flows between the $V_{DD}$ node and I/O pad 12 as illustrated by path 106. When the I/O pad 12 is at a potential significantly higher than the $V_{DD}$ node, current flows between the $V_{DD}$ node and I/O pad 12 as shown in path 105. Using the values previously described, current flows when the potential of the I/O pad 12 is at approximately 6.2 volts or higher. The 6.2 volts is the sum of the BVDSS potential of MOSFET 16, the forward cut-in potential of zener diode 18, and the $V_{DD}$ potential.

The protection circuit without zener diode 19 can protect internal circuits that can safely withstand relatively higher voltages. However, if the protection circuit 10 is to protect internal circuits that can only withstand relatively lower voltages, the zener diode 19 is needed. Referring to the previously used numbers, current flows along path 102 when the I/O pad is at a potential as low as approximately 2.7 volts, but current does not flow along path 105 until the I/O pad is at a potential of at least approximately 6.2 volts. Zener diode 19 may effectively become necessary as technology advances and gate-oxides become thinner.

One skilled in the art appreciates that other options may be available, but the circuit should be analyzed under negative and positive biasing conditions to ensure that the internal circuits to be protected are adequately protected against high-potential and low-potential events.

Figure 2:
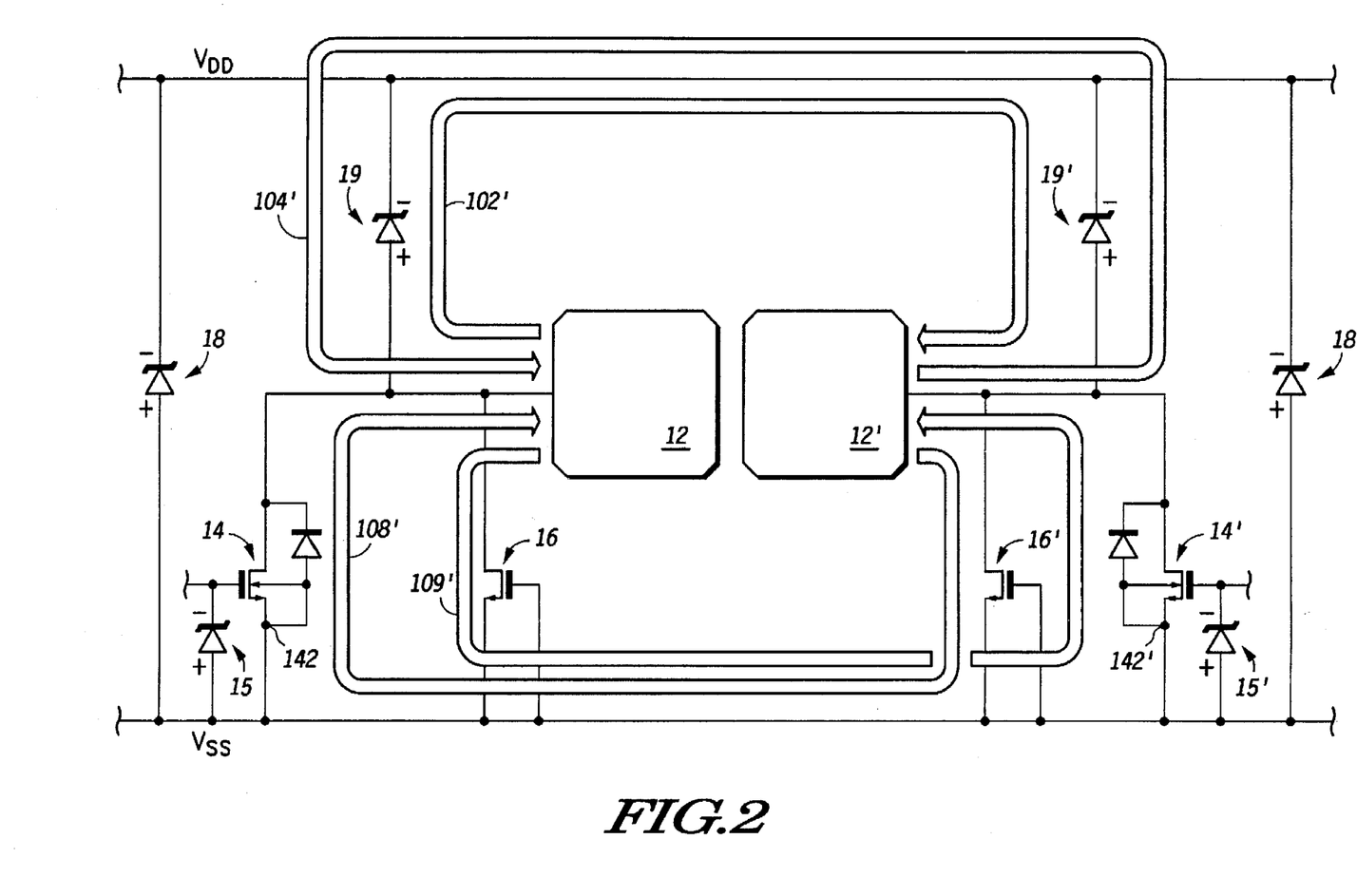
FIG. 2 includes a circuit diagram of a portion of an input protection circuit for an SOI device illustrating pad-to-pad protection.

FIG. 2 includes a circuit diagram illustrating current paths for pad-to-pad biasing. FIG. 2 includes components similar to FIG. 1. The similar components for the second I/O pad are denoted with apostrophes ('). For example, I/O pad 12' is similar to I/O pad 12. The paths 102', 104', 108', and 109' indicate primary current paths for the circuit shown. Other paths similar to paths 105 and 106 exist but are not shown in FIG. 2 for simplicity.

Figure 3:
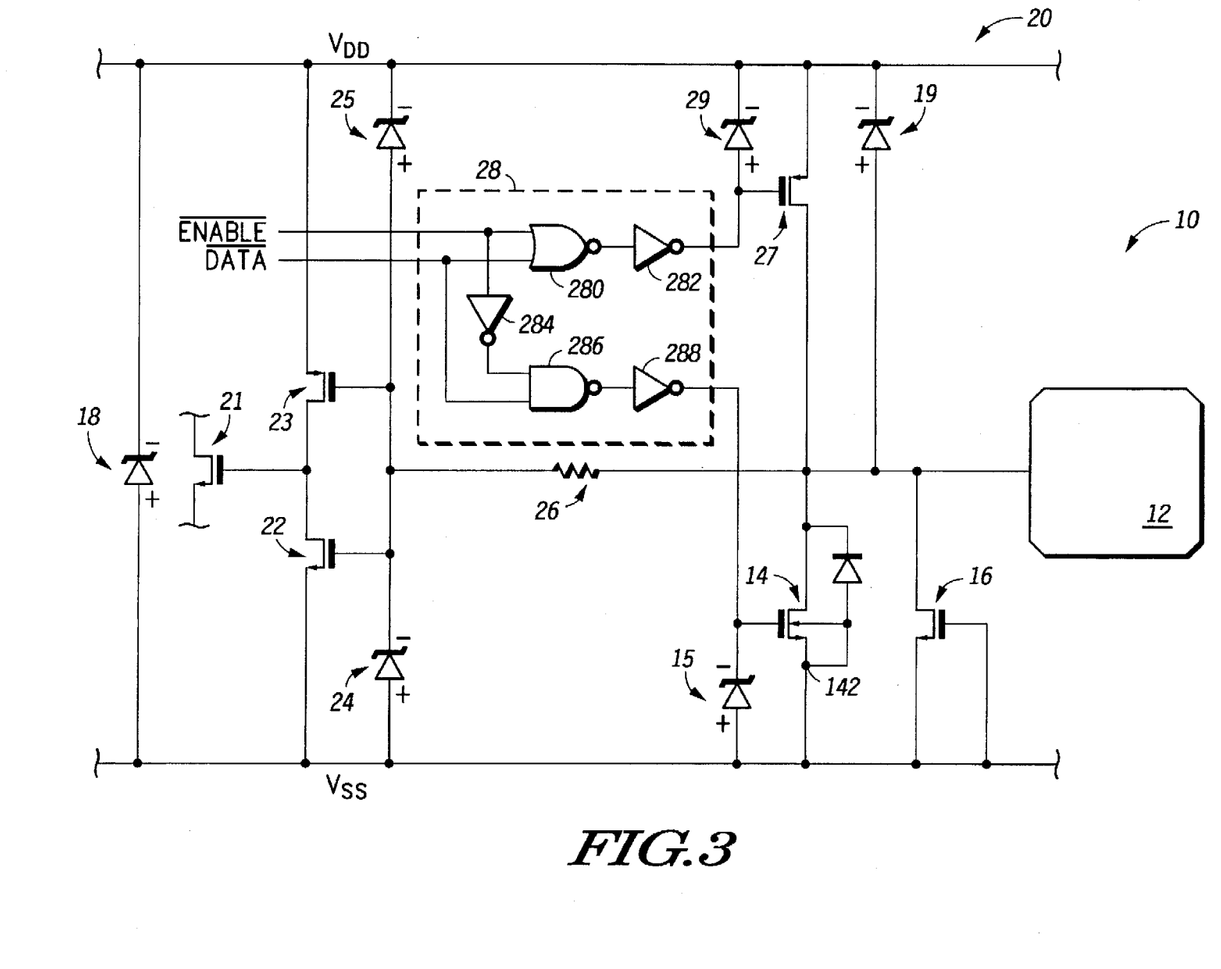
FIG. 3 includes a circuit diagram of a protection circuit for an SOI device that includes the circuit shown in FIG. 1.

FIG. 3 includes a more detailed illustration of the protection circuit 10. The n-channel MOSFET 21 has a source and drain that are electrically connected to other portions of the semiconductor device but are not illustrated in FIG. 3. Typically, the gates of internal MOSFETs, such as the gate of MOSFET 21, are electrically connected to drains of n-channel MOSFET 22 and p-channel MOSFET 23. The sources of MOSFETs 22 and 23 are electrically connected to the $V_{SS}$ and $V_{DD}$ nodes, respectively. The gates of MOSFETs 22 and 23 are electrically connected to an intermediate node.

The protection circuit 10 also includes an output buffer control logic circuit 28 having two inputs and two outputs. $\overline{\text{ENABLE}}$ and $\overline{\text{DATA}}$ are inputs to NOR gate 280. The output of NOR gate 280 is an input to inverter 282. The output of inverter 282 is also an output of the control logic circuit 28 and is electrically connected to the gate of MOSFET 27. $\overline{\text{ENABLE}}$ is also an input for inverter 284. The output of inverter 284 and $\overline{\text{DATA}}$ are inputs to NAND gate 286. The output of NAND gate 286 is the input for inverter 288. The output of inverter 288 is also an output of the control logic circuit 28 and is electrically connected to the gate of MOSFET 14. MOSFETs 14 and 27 are part of the output buffer for the SOI device.

The output buffer control logic circuit 28 determines whether the I/O pad 12 is active as an output pad and allows data to pass to the I/O pad 12. The output buffers are disabled when $\overline{\text{ENABLE}}$ is a "1." In this instance, the I/O pad 12 is an input pad. Transistors 22 and 23 are parts of an input buffer electrically connected to internal MOSFETs. When $\overline{\text{ENABLE}}$ is a "0," the I/O pad 12 is an output pad, and data from $\overline{\text{DATA}}$ can pass to the I/O pad 12. Clearly, I/O pad 12 can act as an input pad or an output pad. However, I/O pad 12 does not act as an input and output pad for the device simultaneously.

The protection circuit 10 includes other MOSFETs, diodes and nodes illustrated in FIG. 3. The negative terminal of zener diode 24 and the positive terminal of zener diode 25 are electrically connected to the intermediate node. The positive terminal of zener diode 24 is electrically connected to the $V_{SS}$ node, and the negative terminal of diode 25 is electrically connected to the $V_{DD}$ node. The intermediate node is resistively connected to the I/O node by resistor 26. P-channel MOSFET 27 has a drain electrically connected to the I/O node and a source electrically connected to the $V_{DD}$ node. The gate of MOSFET 27 is electrically connected to the positive terminal of zener diode 29, and the negative terminal of zener diode 29 is electrically connected to the $V_{DD}$ node.

The protection circuit 10 helps to reduce the likelihood of damage to the internal MOSFETs. For example, assume that the gate dielectric within those MOSFETs is 70 angstroms (Å) thick and has a breakdown voltage of 7.0 volts. If the I/O pad 12 is directly connected to the gates of the internal MOSFETs and the potential of I/O pad 12 is higher than 7.0 volts, the gate dielectrics for internal MOSFETs would be permanently broken down thereby rendering the device effectively useless.

The portion of the protection circuit 10 including zener diodes 24, 25, 15, and 29 and resistor 26 provide secondary protection for the transistor 21 and output buffer control logic 28. Resistor 26 reduces the potential reaching the intermediate node. Zener diodes 24 and 25 are designed to prevent the potential of the intermediate node (and consequently potential across the gate dielectrics of MOSFETs 22 and 23) from having an absolute value higher than 7.0 volts.

Similarly, zener diodes 15 and 29 are designed to prevent the potential across the gate dielectrics of MOSFETs 14 and 27 from having an absolute value higher than 7.0 volts. If the zener diodes 24, 25, and 29 have the same forward biasing cut-in potential and reverse biasing breakdown voltage as zener diodes 15 and 18, the potential of the intermediate node should not be lower than –0.7 volts and higher than 5.0 volts.

Although a number of specific potentials are discussed, those skilled in the art can tailor the potentials for the specific supply potentials and components to be protected. For example, much of the discussion has been focused on a 2.0 volt potential difference between VDD and VSS and a gate dielectric breakdown voltage of 7.0 volts. If the potential difference between VDD and VSS is 1.0 volt and a gate dielectric breakdown voltage of 5.0 volts, the components within the protection circuit 10 may be required to operate at potentials having values closer to zero.

In other embodiments, a pad operates at a potential that is not in the range of the $V_{DD}$ and $V_{SS}$ potentials. For example, the pad operates in the range of $V_{SS}$ and $-V_{PP}$ potentials, the latter of which could be about –2.0 volts. The circuit shown in FIG. 3 can be used, but the $V_{DD}$ node shown in FIG. 3 is at the $V_{SS}$ potential, and the $V_{SS}$ node shown in FIG. 3 is at the $-V_{PP}$ potential. Also, the electrical characteristics of the components shown in FIG. 3, such as breakdown voltages, BVDSS, etc., may need to be changed to adequately protect internal circuitry. More generally, the supply node closer to the bottom of FIG. 2 is at a lower potential than the supply node closer to the top of FIG. 3.

Figure 4:
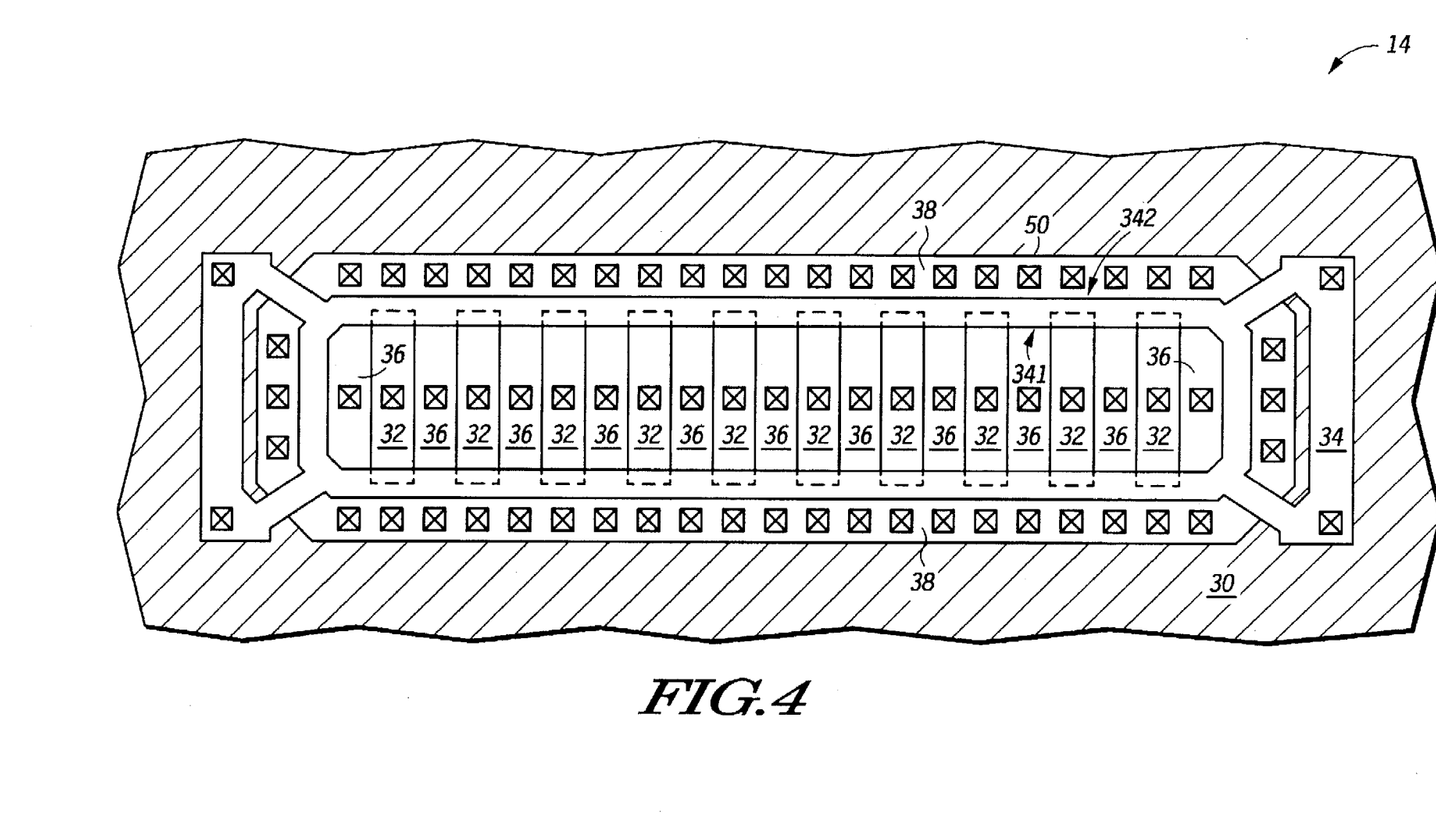
FIG. 4 includes a top view of a body-tied MOSFET as used in the input protection circuits of FIGS. 1 and 3 in accordance with an embodiment of the present invention.

The inventor has discovered a layout of transistor 14 that works particularly well with the device 20. FIG. 4 includes an illustration of a top view of the body-tied MOSFET 14 illustrated in FIGS. 1 and 3. A closed-gate electrode 34 overlies a field isolation region 30 and a semiconductor island 50. The shape of the closed-loop gate electrode 34 can be circular, oval, elliptical, convex, or any polygon type of shape including square, rectangular, hexagonal, octagonal, etc. The closed-gate electrode 34 is used to reduce leakage current because the gate electrode 34 does not cross over a channel-field isolation edge because the MOSFET 14 does not have a channel-field isolation edge.

As seen in FIG. 4, the closed-gate electrode 34 has an inner edge 341 and an outer edge 342. The source regions 36 and body-tie regions 32 lies adjacent to the inner edge 341, and the drain regions 38 lies adjacent to the outer edge 342. Edges of the regions 32 and 36 near the closed-gate electrode 34 are formed self-aligned to the closed-gate electrode 34 or sidewall spacers (not shown in FIG. 4) that lie adjacent to the closed-gate electrode 34.

The dashed lines adjacent to body-tie regions 32 illustrate the location of the masks used for the doping steps used to form regions 32, 36, and 38. When regions 32 are being formed, a mask covers all of transistor 14 except regions 32 and the portions of the closed-gate electrode 34 lying within the dashed lines. The closed-gate electrode 34 prevents a significant amount of dopant used to form regions 32 from reaching the channel region that underlies a portion of the closed-gate electrode 34. A mask of the inverse image is used to form regions 36 and 38. All of transistor 14 is uncovered except for regions 32 and the portions of the closed-gate electrode 34 lying outside the dashed lines.

Each of the contacts to the drain region, source regions 36, body-tie regions 32, and closed-gate electrode 34 are illustrated by ⊠s. Before forming contacts, a conductive strap is formed to electrically connect each of the regions 32 and 36 to one another. The conductive strap typically includes any material used for a local interconnect, such as a silicide, refractory-metal nitride, and the like. More details regarding the formation of the body-tied MOSFET 14 are found in U.S. patent application Ser. No. 08/625,861, entitled 'Semiconductor-On-Insulator Device And A Process For Forming the Device' by Jeremy Smith et al., which is herein incorporated by reference.

The transistor 14 has an effective (electrically measured) channel length of about 0.9 microns and an effective channel width of about 200 microns. As used in this specification, the effective channel length is approximately the distance between one of the drain region 38 and its closest the source region 36 underneath the gate electrode 34. The effective channel width is approximately the sum of individual channel regions near the individual source regions 36. The source regions 36 and body ties 32 will be electrically connected to one another.

Many conventional MOSFETs that have closed-gate electrodes place the drain region, as opposed to the source region, near the inner edge of the gate electrode. When the drain region is near the inner edge of the gate electrode, the junction capacitance of the drain region is lower because the junction area between the drain region and channel region is smaller (also the area over the substrate is smaller). Lower junction capacitance generally forms a faster MOSFET.

Contrary to conventional wisdom, the drain regions 38 is adjacent to the outer edge 342 of the closed-loop gate electrode 34. The placement of the drain region adjacent to the outer edge 342 allows a higher potential to be placed on the drain regions 38 before there is a significant leakage current between the drain and channel regions.

Although a specific layout for a body-tied transistor 14 is given, other types of body-tied transistors could be used in place of the one illustrated in FIG. 4. Designers of protection circuits are capable of determining what type of body-tied transistor should be used.

The components of device 20 are formed within a semiconductor layer having a thickness in a range of 500–1000 angstroms thick. In this specification, interfacial area can be expressed as a length because the area is the product of the length and the thickness of the semiconductor layer. Interfacial areas of diodes are expressed as lengths.

The body-tied MOSFET 14 includes a drain diode that is formed when the channel region and drain region meet. The destructive breakdown current of the forward biased drain diode can be varied by changing the ratio of the individual source region area to the body-tie region area (tie frequency). In FIG. 5, a plot of forward bias voltage ($V_f$) versus forward bias current ($I_f$) is illustrated for three different body-tie ratios. This data is for a MOSFET that has a total electrical width of 25 microns (i.e., the sum of the widths of individual source regions 36). The drain diode is approximately 50 microns long. When the S/B tie ratio is 1:1, a current of approximately 6 milliamps/micron is passed before destructive failure. At S/B tie ratio of 2.5:1, approximately 4.6 milliamps/micron is passed before failure (36 microns of drain diode), and at S/B tie ratio of 5:1, approximately 3.0 milliamps/micron is passed (31 microns of drain diode). As can be seen in FIG. 5, the current carrying ability can be increased by increasing the tie frequency. This is in part due to more available drain diode area, but also a reduction in series resistance of the diode that reduces resistive heating.

Figure 6:
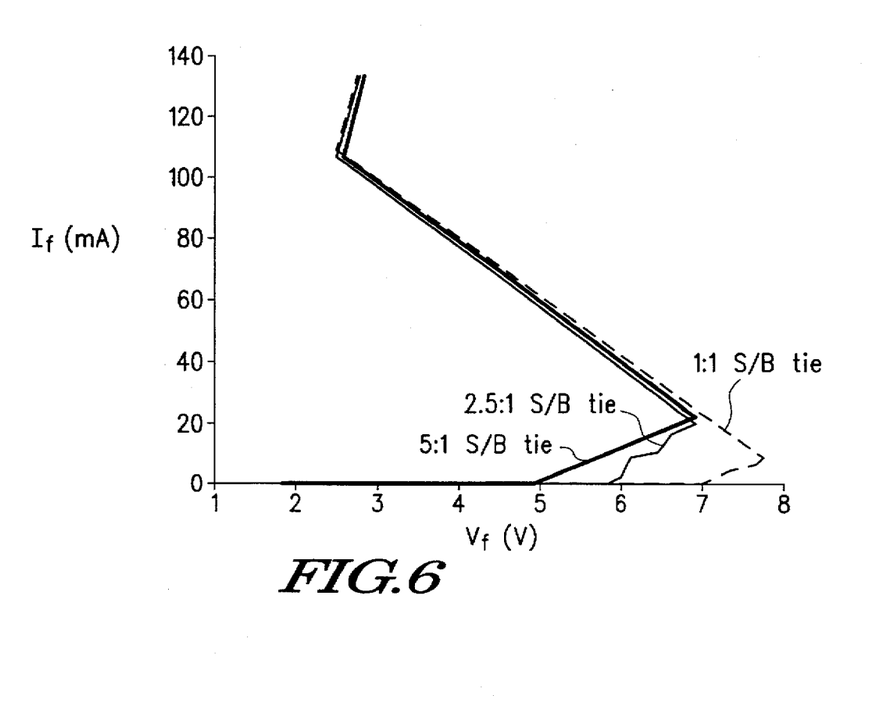
FIG. 6 includes a plot of a gate-grounded breakdown voltage characteristic as the tie-frequency of a body-tied MOSFET is varied.

FIG. 6 illustrates how the S/B tie ratio affects the breakdown voltage of a reversed biased drain diode of a MOSFET. The breakdown voltage is the voltage of the drain ($V_r$) when $I_r$ is greater than zero. At an S/B tie ratio of 1:1, the breakdown of the drain diode occurs at a potential of approximately 7.0 volts. $V_r$ is approximately 5.8 volts at S/B tie ratio of 2.5:1, and $V_r$ is approximately 5.0 volts at S/B tie ratio of 5:1.

In the future, $V_{DD}$ potentials will become closer to zero. As the $V_{DD}$ potential decreases, the S/B tie ratio should be increased. However, if the S/B tie ratio gets too large, the benefit of the body ties may become too small because one body tie has too much channel region to tie. An S/B tie ratio of greater than 10:1 may be a practical upper limit, but this number is not meant to be limiting to the present invention.

Electrically measured dimensions of some of the components in FIG. 3 are presented. Zener diode 18 has a pn junction surface area approximately 50 microns long, zener diode 19 has a pn junction surface area approximately 400 microns long, and each of zener diodes 15, 24, 25, and 29 has a pn junction surface area approximately 25 microns long. MOSFET 16 has an effective channel length of approximately 0.6 microns and an effective channel width of approximately 800 microns, and MOSFET 27 has an effective channel length of approximately 0.6 microns and an effective channel width of approximately 400 microns. While these numbers are specific, those of ordinary skill are able to determine the electrically measured dimensions that work best with their circuits.

The embodiments of the present invention allow an input protection circuit to be used with a SOI device to properly protect the digital circuits or other sensitive components from electrostatic events that occur at an I/O pad. The design allows the I/O pad to reach both high and low voltages without adversely affecting the internal circuits that are to be protected. During an electrostatic event, current can flow between the I/O pad 12 and $V_{DD}$ under both negative and positive biasing conditions, between the I/O pad 12 and $V_{SS}$ under negative and positive biasing conditions, and between any combination of two I/O pads. The design does not require ties through a buried insulator layer to an underlying substrate. Therefore, a truly SOI device including input protection circuits is formed. Another benefit of the present invention is that it can be integrated into a process flow without the incorporation of marginal or difficult process steps.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

I claim:

1. A protection circuit comprising:

a pad node;

a first supply node that is coupled to receive a first potential;

a first transistor having a first current electrode, a channel, and a second current electrode, wherein:

the first current electrode of the first transistor is electrically connected to both the first supply node and the channel;

the second current electrode of the first transistor is electrically connected to the pad node; and a pn diode is formed at a junction between the channel and second current electrode of the first transistor;

a second transistor having a first current electrode, a second current electrode, and a channel which electrically floats by remaining unconnected with either the first or second current electrodes thereof, wherein:

the first current electrode of the second transistor is electrically connected to the first supply node; and the second current electrode of the second transistor is electrically connected to the pad node;

the second transistor functioning as a primary current path for current flow from the pad node to the first supply node;

a second supply node that is coupled to receive a second potential that is higher than the first potential; and a rail clamp having a first terminal and a second terminal, wherein:

the first terminal of the rail clamp is electrically connected to the first supply node; and the second terminal of the rail clamp is electrically connected to the second supply node.

2. The protection circuit of claim 1, wherein the rail clamp is a zener diode.

3. The protection circuit of claim 1, wherein the second transistor has a control electrode that is electrically connected to the first current electrode of the second transistor.

4. The protection circuit of claim 1, further comprising a first diode having a positive terminal and a negative terminal, wherein:

the positive terminal of the first diode is coupled to the pad node; and the negative terminal of the first diode is coupled to the second supply node.

5. The protection circuit of claim 4, further comprising a resistor, a second diode, and a third diode, wherein:

the resistor has a first terminal and a second terminal;

each of the second diode and the third diode has a positive terminal and a negative terminal;

the first terminal of the resistor is electrically connected to the pad node;

the positive terminal of the second diode is electrically connected to the first supply node;

the negative terminal of the third diode is electrically connected to the second supply node; and the second terminal of the resistor, the negative terminal of the second diode, and the positive terminal of the third diode are electrically connected to one another.

6. The protection circuit of claim 1, further comprising a third transistor having a first current electrode and a second current electrode, wherein:

the first current electrode of the third transistor is electrically connected to the second supply node; and the second current electrode of the third transistor is electrically connected to the pad node.

7. The protection circuit of claim 6, further comprising a first diode and a second diode, wherein:

each of the first diode and the second diode has a positive terminal and a negative terminal;

the positive terminal of the first diode is electrically connected to the first supply node;

the negative terminal of the first diode is electrically connected to a control electrode of the first transistor;

the positive terminal of the second diode is electrically connected to a control electrode of the third transistor; and the negative terminal of the second diode is electrically connected to the second supply node.

8. The protection circuit of claim 1, wherein:

the protection circuit is electrically connected to a pad; and the second current electrodes of the first and second transistors and the pad are at approximately a same potential.

9. The protection circuit of claim 1, wherein the protection circuit is part of a semiconductor-on-insulator device.

10. A circuit for a semiconductor-on-insulator device comprising:

a pad; and a protection circuit including:

a first supply node that is coupled to receive a first potential;

a first transistor having a first current electrode and a second current electrode, wherein:

the first current electrode of the first transistor is connected to the first supply node; and the second current electrode of the first transistor is connected to the pad; and the first transistor is a body-tied transistor;

a second transistor having a first current electrode, a second current electrode, and a control electrode, wherein:

the first current electrode and the control electrode of the second transistor are connected to the first supply node; and the second current electrode of the second transistor is connected to the pad, the first transistor being a body-tied transistor having an increased voltage at which parasitic bipolar action occurs between the first and second current electrodes thereof and being electrically connected in parallel with the second transistor to make a primary current path between the pad and first supply node be through the second transistor rather than the first transistor;

a second supply node that is coupled to receive a second potential that is higher than the first potential; and a first zener diode having a positive terminal and a negative terminal, wherein:

the positive terminal of the first zener diode is connected to the first supply node; and the negative terminal of the first zener diode is connected to the second supply node.

11. The circuit of claim 10, wherein the protection circuit further comprises a second zener diode having a positive terminal and a negative terminal, wherein:

the positive terminal of the second zener diode is connected to the pad; and the negative terminal of the second zener diode is connected to the second supply node.

12. The circuit of claim 11, wherein the protection circuit further comprises a resistor, a third zener diode, and a fourth zener diode, wherein:

the resistor has a first terminal and a second terminal;

each of the third zener diode and the fourth zener diode has a positive terminal and a negative terminal;

the first terminal of the resistor is connected to the pad;

the positive terminal of the third zener diode is connected to the first supply node;

the negative-terminal of the fourth zener diode is connected to the second supply node; and the second terminal of the resistor, the negative terminal of the third zener diode, the positive terminal of the fourth zener diode are connected to one another.

13. The circuit of claim 12, further comprising a third transistor and a fourth transistor, wherein:

each of the third transistor and the fourth transistor includes a control electrode, a first current electrode and a second current electrode;

the first current electrode of the third transistor is connected to the first supply node;

the first current electrode of the fourth transistor is connected to the second supply node;

the second current electrodes of the third and fourth transistors are connected to each other; and the control electrodes of the third and fourth transistors and the second terminal of the resistor are connected to one another.

14. The circuit of claim 13, further comprising a fifth transistor having a first current electrode and a second current electrode, wherein:

the first current electrode of the fifth transistor is connected to the second supply node; and the second current electrode of the fifth transistor is connected to the pad.

15. The circuit of claim 14, further comprising a fifth zener diode and a sixth zener diode, wherein:

each of the fifth zener diode and the sixth zener diode includes a positive terminal and a negative terminal;

the positive terminal of the fifth zener diode is connected to the first supply node;

the negative-terminal of the fifth zener diode is connected to a control electrode of the first transistor;

the positive terminal of the sixth zener diode is connected to a control electrode of the fifth transistor; and the negative terminal of the sixth zener diode is connected to the second supply node.

16. The circuit of claim 15, wherein:

each of the third and fourth transistors is part of an input buffer circuit;

the second current electrodes of the third and fourth transistors are connected to an input circuit; and each of the first and fifth transistors has a control electrode and is part of an output buffer circuit;

the control electrodes of the first and fifth transistors are connected to an output circuit; and the pad is an input/output pad.

17. The circuit of claim 13, wherein:

each of the third and fourth transistors is part of an input buffer circuit;

the second current electrodes of the third and fourth transistors are connected to a first input circuit; and the pad is an input pad.

18. The circuit of claim 11, wherein the protection circuit further comprises a third transistor having a first current electrode and a second current electrode, wherein:

the first current electrode of the third transistor is connected to the second supply node; and the second current electrode of the third transistor is connected to the pad.

19. The circuit of claim 18, wherein:

each of the first and third transistors has a control electrode and is part of an output buffer circuit;

the control electrodes of the first and third transistors are connected to an output circuit; and the pad is an output pad.

20. The circuit of claim 18, further comprising a third zener diode and a fourth zener diode, wherein:

each of the third and fourth zener diodes has a positive terminal and a negative terminal;

each of the first and third transistors has a control electrode;

the positive terminal of the third zener diode is connected to the first supply node;

the negative terminal of the third zener diode is connected to the control electrode of the first transistor;

the positive terminal of the fourth zener diode is connected to the control electrode of the third transistor; and the negative terminal of the fourth zener diode is connected to the second supply node.

21. The circuit of claim 10, wherein the pad and the second current electrodes of the first and second transistors are at approximately a same potential.

22. A protection circuit comprising:

a first pad electrically connected to a first node;

a first transistor having a first current electrode, a channel, and a second current electrode, the first current electrode of the first transistor is electrically connected to both a second node and the channel;

the second current electrode is electrically connected to the first node; and a first body tie diode is formed at a junction between the channel and second current electrode of the first transistor;

a second transistor having a first current electrode and a second current electrode, wherein:

the first current electrode of the second transistor is electrically connected to the second node; and the second current electrode of the second transistor is electrically connected to the first node;

a first rail clamp having a first terminal and a second terminal, wherein:

the first terminal of the first rail clamp is electrically connected to the second node; and the second terminal of the first rail clamp is electrically connected to a third node;

a second pad being electrically connected to a fourth node;

a third transistor having a first current electrode and a second current electrode, wherein:

the first current electrode of the third transistor is electrically connected to the second node; and the second current electrode of the third transistor is electrically connected to the fourth node;

a second body tie diode is formed at a junction between the channel and second current elect-rode of the third transistor; and a fourth transistor having a first current electrode and a second current electrode, wherein:

the first current electrode of the fourth transistor is electrically connected to the second node; and the second current electrode of the fourth transistor is electrically connected to the fourth node.

23. The protection circuit of claim 22, wherein the first rail clamp is a zener diode.

24. The protection circuit of claim 22, further comprising a second rail clamp having a first terminal and a second terminal, wherein:

the first terminal of the second rail clamp is coupled to the second node; and the second terminal of the second rail clamp is coupled to the third node.

25. The protection circuit of claim 24, wherein the first and second rail clamps are zener diodes.

26. The protection circuit of claim 22, wherein:

the second transistor has a control electrode that is electrically connected to the first current electrode of the second transistor; and the fourth transistor has a control electrode that is electrically connected to the first current electrode of the fourth transistor.

27. The protection circuit of claim 22, further comprising a first diode and a second diode, wherein:

each of the first and second diodes has a positive terminal and a negative terminal;

the positive terminal of the first diode is coupled to the first node;

the negative terminal of the first diode is coupled to the third node;

the positive terminal of the second diode is coupled to the fourth node; and the negative terminal of the second diode is coupled to the third node.

28. The protection circuit of claim 27, wherein:

the second current electrodes of the first and second transistors, and the positive terminal of the first diode are electrically connected to the first node;

the first current electrodes of the first, second, third, and fourth transistors and the first terminal of the first rail clamp are electrically connected to the second node;

the second terminal of the first rail clamp and the negative terminals of the first and second diodes are electrically connected to the third node; and the second current electrodes of the third and fourth transistors and the positive terminal of the second diode are electrically connected to the fourth node.

29. The protection circuit of claim 22, wherein the protection circuit is part of a semiconductor-on-insulator device.

* * * * *